United States Patent
Kim et al.

(10) Patent No.: US 6,747,354 B2
(45) Date of Patent: Jun. 8, 2004

(54) SEMICONDUCTOR DEVICES HAVING MULTILEVEL INTERCONNECTIONS AND METHODS FOR MANUFACTURING THE SAME

(75) Inventors: Hyun-young Kim, Seoul (KR); In-sun Park, Kyungki-do (KR); Hyeon-deok Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/370,222

(22) Filed: Feb. 19, 2003

(65) Prior Publication Data
US 2003/0160333 A1 Aug. 28, 2003

(30) Foreign Application Priority Data

Feb. 27, 2002 (KR) ......................... 2002-10539

(51) Int. Cl.[7] .............................. H01L 23/48
(52) U.S. Cl. ............... 257/751; 257/750; 257/758; 257/763; 257/764; 257/765
(58) Field of Search .................... 257/751, 750, 257/758, 763–765

(56) References Cited

U.S. PATENT DOCUMENTS

| 5,356,836 A | * 10/1994 | Chen et al. ............ 438/627 |
| 5,488,014 A | * 1/1996 | Harada et al. .......... 438/625 |
| 5,523,259 A | * 6/1996 | Merchant et al. ....... 438/720 |
| 5,703,403 A | * 12/1997 | Sobue et al. ........... 257/751 |
| 5,985,759 A | * 11/1999 | Kim et al. ............ 438/653 |
| 5,990,011 A | * 11/1999 | McTeer ................ 438/692 |
| 6,189,209 B1 | * 2/2001 | Saran .................. 29/852 |
| 6,268,290 B1 | * 7/2001 | Taguchi et al. ........ 438/688 |
| 6,281,104 B1 | * 8/2001 | Batra et al. ........... 438/597 |
| 6,413,864 B1 | * 7/2002 | Pyo ................... 438/687 |
| 6,424,044 B1 | * 7/2002 | Han et al. ............ 257/758 |
| 6,465,888 B2 | * 10/2002 | Chooi et al. .......... 257/751 |
| 2002/0109235 A1 | * 8/2002 | Leiphart .............. 257/774 |

FOREIGN PATENT DOCUMENTS

JP    63-77117    * 4/1988    ........... 438/643

* cited by examiner

Primary Examiner—Jsamine Clark
(74) Attorney, Agent, or Firm—Myers Bigel Sibley & Sajovec

(57) ABSTRACT

A semiconductor device includes a first metal interconnection layer on a semiconductor substrate, an intermetal dielectric layer on the first metal interconnection layer and a second metal interconnection layer formed on the intermetal dielectric layer. A contact stud electrically connects the first and second metal interconnection layers through the intermetal dielectric layer, and includes a titanium/aluminum (TiAlx) core extending from the first metal interconnection layer toward the second metal interconnection layer. In method embodiments, a portion of an insulating layer of a semiconductor substrate is removed to form a hole that exposes an underlying conductive layer. A glue layer, e.g., a titanium (Ti) layer, is formed on bottom and sidewalls of the hole. A Ti seed layer is formed on the glue layer in the hole. An aluminum-containing layer is formed on the Ti seed layer. The substrate is thermally treated to form a contact stud including a TiAlx core.

34 Claims, 9 Drawing Sheets

SEMICONDUCTOR DEVICES HAVING MULTILEVEL INTERCONNECTIONS AND METHODS FOR MANUFACTURING THE SAME

RELATED APPLICATION

This application claims priority to Korean Patent Application 2002-10539, filed on Feb. 27, 2002, the contents of which are herein incorporated by reference in their entirety.

BACKGROUND OF THE INVENTION

The present invention relates to semiconductor integrated circuit (IC) devices and methods for manufacturing the same, and more particularly, to semiconductor devices having multilevel interconnections and methods for manufacturing the same.

As the density and integration of semiconductor devices increases, the number of multilevel metal interconnections generally increases. It is generally desirable that metal interconnections are economical to fabricate while having low electrical resistance and high reliability. To satisfy these requirements, aluminum (Al) is widely used for metal interconnections.

As the critical dimensions of the circuit become smaller, technical limits in applying a conventional technique to a deposition process for forming Al interconnections when manufacturing a semiconductor device can be approached. In forming a via contact stud for electrically connecting the Al interconnection on a lower layer with the Al interconnection on an upper layer, it is desirable to form the via contact stud such that it provides a low contact resistance as well as completely filling the inside of a via hole with an interconnection material. Various processes have been developed to obtain desired electrical and filling characteristics in forming via contact plugs for multilevel interconnections.

Figure 1:
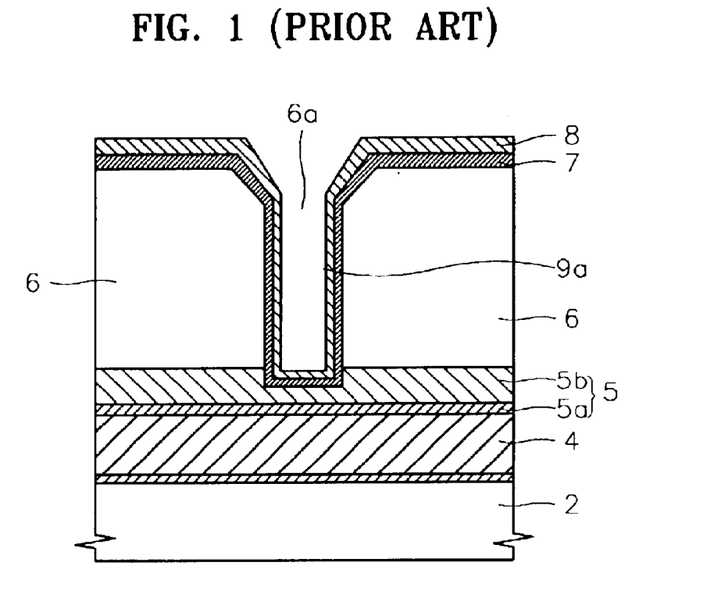
FIGS. 1 and 2 are sectional views depicting a conventional method for manufacturing a semiconductor device having multilevel interconnections.
Figure 2:
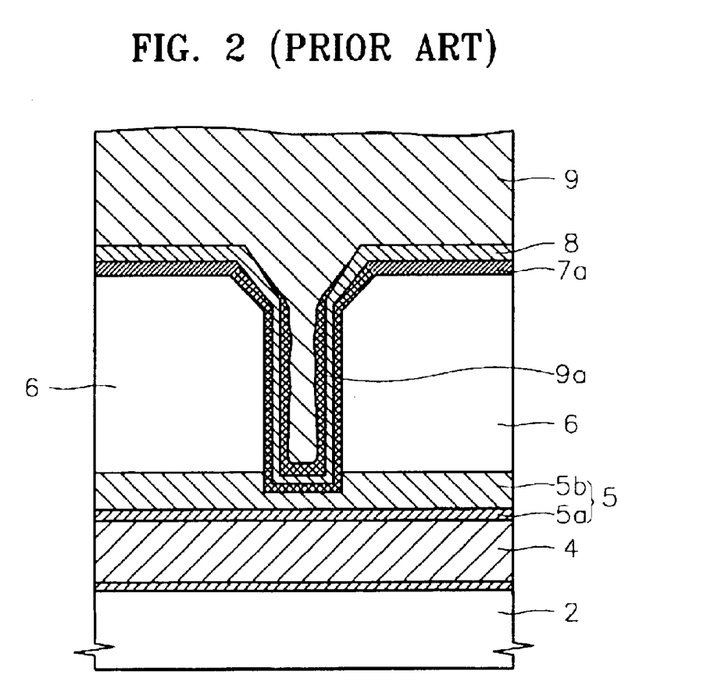

FIGS. 1 and 2 are sectional views depicting a conventional method for manufacturing a semiconductor device having multilevel interconnections. Referring to FIGS. 1 and 2, a lower metal interconnection layer including an Al layer 4 and a capping layer 5 is formed on a semiconductor substrate 2 having predetermined circuit patterns (not shown) and insulating layer (not shown) thereon. In the illustrated case, the capping layer 5 is formed of a titanium (Ti) layer 5a and titanium nitride (TiN) layer 5b. An intermetal dielectric layer 6 having a via hole 6a, which exposes a portion of the capping layer 5, is formed on the lower metal interconnection layer. A glue layer 7 formed of Ti and a TiN barrier layer 8 are successively formed in the hole 6a. In order to form multilevel interconnections having a feature size corresponding to a submicron design rule, the width of the via hole 6a is reduced to less than 250 nm, so that aspect ratio is increased. Consequently, the step coverage of the TiN barrier layer 8 may be reduced in the via hole 6a, lowering the thickness of the TiN barrier layer 8 in the via hole 6a, such that and TiN barrier layer 8 may not properly serve as a barrier.

In order to complete a via contact stud and an upper metal interconnection layer 9 as shown in FIG. 2, an Al layer is deposited on the resultant structure by a sputtering process. The Al layer is reflowed by a thermal process to fill the inside of the via hole 6a with the interconnection material. As a result, the Ti in the glue layer 7 and the Al in the Al layer may react to form uneven titanium/aluminum alloy (TiAlx) layers 7a and 9a in the via hole 6a.

When uneven TiAlx layers like the layers 7a and 9a are formed on the via contact studs in a wafer, the contacts in a wafer may have a uneven profile. Accordingly, the resistance distributions of the contacts may be undesirable, and the resistance characteristic may be further degraded after the thermal process. Moreover, a high resistance material, such as aluminum nitride (AlN), may be formed by reaction between the TiN barrier layer 8 and the Al layer thereon, so that a further increase in the contact resistance and deterioration of reliability may occur.

Figure 3:
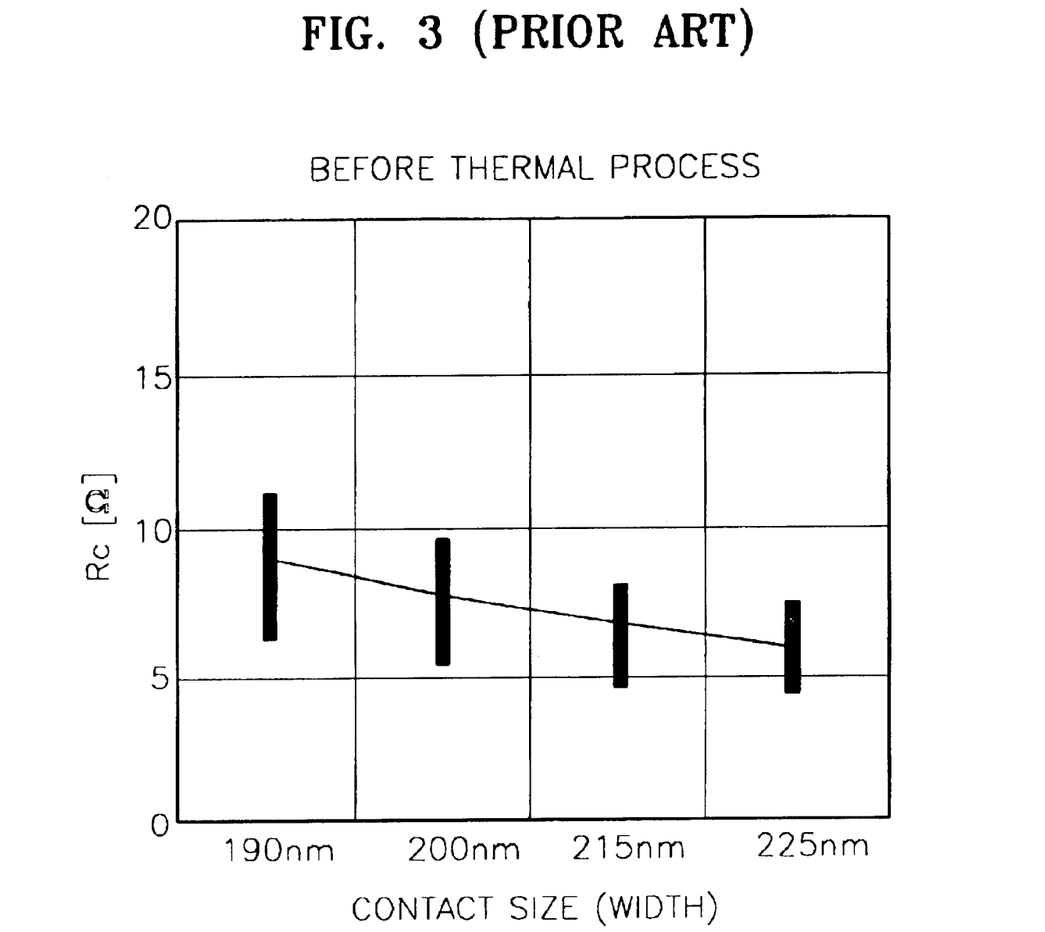
FIGS. 3 and 4 are graphs illustrating resistance distributions of a via contact stud in a conventional semiconductor device.
Figure 4:
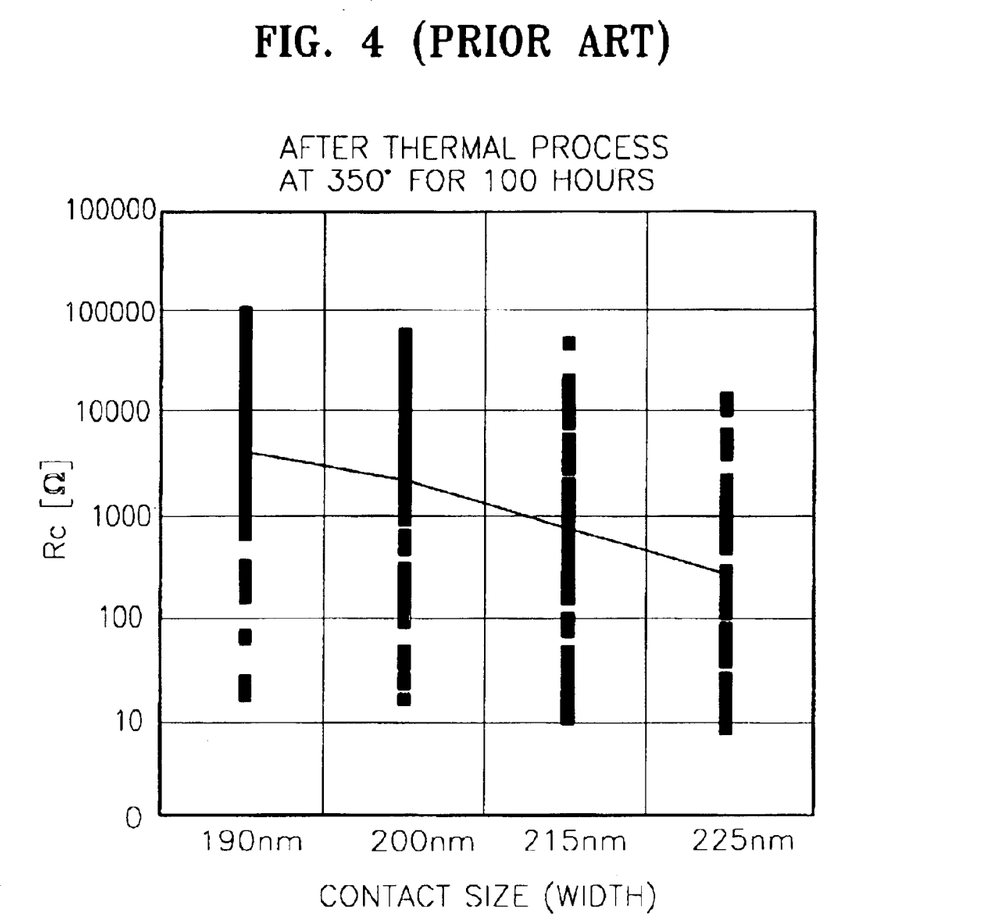

FIGS. 3 and 4 are graphs illustrating resistance distributions via contact studs in a conventional semiconductor device as described above. FIG. 3 illustrates the result of the contact resistance distribution of the via contact studs shown in FIG. 2 according to the size of the via contact studs, before the thermal process is performed. FIG. 4 illustrates the result of the contact resistance distribution of the via contact stud shown in FIG. 2, after a hot temperature storage (HTS) reliability test in which the thermal process is performed at a temperature of 350° C. for 100 hours in a nitrogen atmosphere.

As shown in FIGS. 3 and 4, the resistance of the via contact stud in the conventional semiconductor device is about 8 Ω for each contact while the resistance distribution is plus or minus 5 Ω, before the thermal process. However, as shown in FIG. 4, after the thermal process at a temperature of 350° C. for 100 hours, the contact resistance can deteriorate to tens and thousands of Ω, with a greater resistance distribution.

Accordingly, as the width of the contact size is reduced to less than 250 nm in the via contact stud structures of the conventional semiconductor device, contacts may have uneven profiles caused by the high resistance material, such as the AlN which is formed by the reaction between a TiN barrier layer and an Al layer, and by unevenness in the TiAlx layer. Contact resistance may increase while deteriorating the resistance distribution, so that reliability of the device may be degraded.

SUMMARY OF THE INVENTION

According to some embodiments of the present invention, a semiconductor device includes a first metal interconnection layer on a semiconductor substrate, an intermetal dielectric layer on the first metal interconnection layer, and a second metal interconnection layer on the intermetal dielectric layer. A contact stud electrically connects the first and second metal interconnection layers through the intermetal dielectric layer, and includes a titanium/aluminum (TiAlx) core extending from the first metal interconnection layer toward the second metal interconnection layer.

The contact stud may further include a TiAlx liner disposed on bottom and sidewalls of the TiAlx core and a titanium nitride (TiN) barrier layer interposed between the TiAlx core and the TiAlx liner. The first metal interconnection layer and/or the second metal interconnection layer may include Al. For example, the first metal interconnection layer may include an aluminum-containing layer and a reflection barrier capping layer on the aluminum-containing layer. The reflection barrier capping layer may include a titanium (Ti) layer on the aluminum-containing layer and a titanium nitride (TiN) layer on the Ti layer. The intermetal dielectric layer may include a first tetraethylorthosilicate (P-TEOS) layer on the first metal interconnection layer, a flowable oxide (FOX) layer on the first P-TEOS layer, and a second P-TEOS layer on the FOX layer.

According to method embodiments of the invention, a contact stud in a semiconductor device is fabricated. A portion of an insulating layer of a semiconductor substrate is removed to form a hole that exposes an underlying conductive layer. A glue layer is formed on bottom and sidewalls of the hole. A Ti seed layer is formed on the glue layer in the hole. An aluminum-containing layer is formed on the Ti seed layer. The substrate is thermally treated to form a contact stud that extends through the hole in the insulating layer to electrically contact the underlying conductive layer, the contact stud including a TiAlx core. A TiN barrier layer may be formed on the glue layer in the hole before forming the Ti seed layer. The thermal treating may include maintaining the substrate at a temperature of about 350° C. to about 550° C. Thermal treatment may reflow the aluminum-containing layer and react aluminum in the reflowed aluminum-containing layer with titanium in the Ti seed layer to form the TiAlx core.

DETAILED DESCRIPTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

FIGS. 5 through 11 are sectional views of fabrication products depicting operations for manufacturing a semiconductor device having multilevel interconnections according to some embodiments of the present invention.

Figure 5:
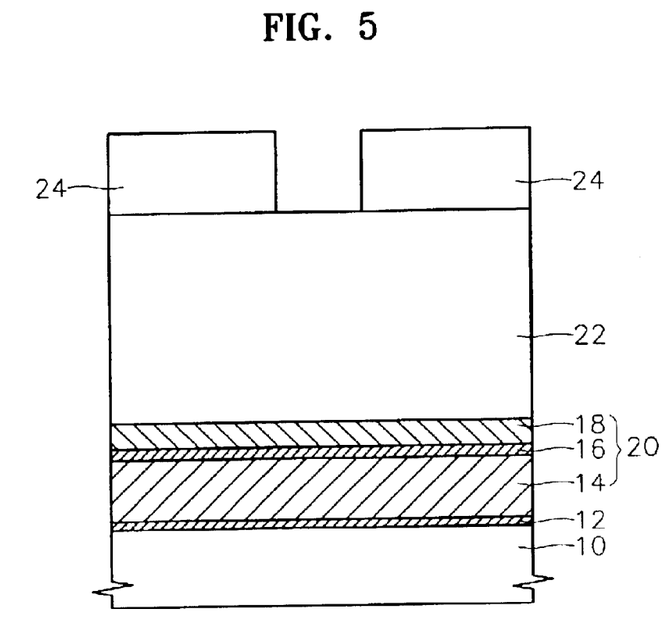
FIGS. 5 through 11 are sectional views of intermediate fabrication products depicting operations for manufacturing a semiconductor device having multilevel interconnections according to embodiments of the present invention.

Referring to FIG. 5, a glue layer 12 is formed of titanium (Ti) or titanium nitride (TiN) to a thickness of about 100 to 500 Å on a semiconductor substrate 10, which has circuit patterns (not shown) and an insulating layer (not shown) thereon. A first metal interconnection layer 20 is formed thereon. In order to form the first metal interconnection layer 20, a first metal layer 14 of aluminum (Al) or Al alloy is formed to a thickness of about 3500 Å, and a reflection barrier capping layer is formed on the first metal layer 14. The reflection barrier capping layer includes a Ti layer 16 with a thickness of about 100 to 200 Å and a TiN layer 18 with a thickness of about 400 to 800 Å. In this case, the TiN layer 18 may operate as an etch stopper in an etching process for a subsequently formed intermetal dielectric layer, as well as a reflection barrier layer.

Figure 6:
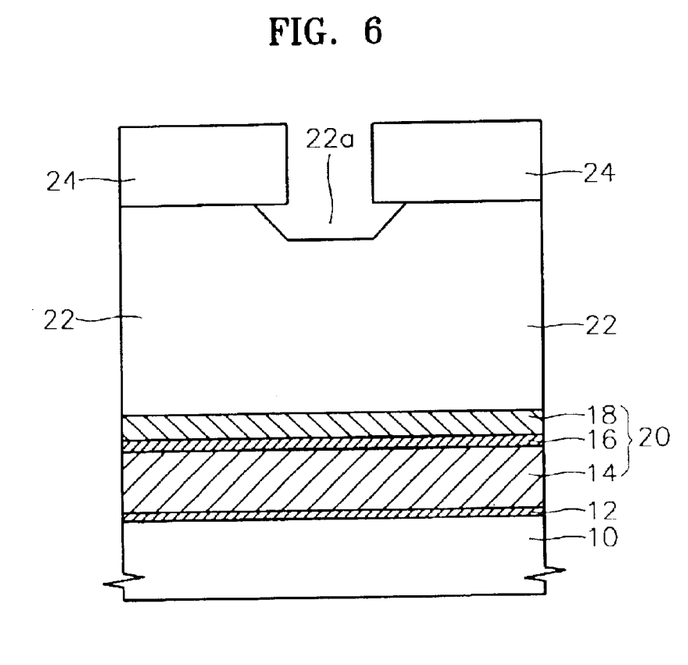

An intermetal dielectric layer 22 is formed on the TiN layer 18 to a thickness of about 6500 Å. The intermetal dielectric layer 22 may be formed by successively depositing a first tetraethylorthosilicate (P-TEOS) film, a flowable oxide film (Fox), and a second P-TEOS film on the TiN layer 18. A photoresist pattern 24, which exposes a portion of the intermetal dielectric layer 22, is formed on the intermetal dielectric layer 22. Referring to FIG. 6, the exposed portion of the intermetal dielectric layer 22 is wet etched by using the photoresist pattern 24 as an etch mask, so that a recess 22a is formed on the intermetal dielectric layer 22.

Figure 7:
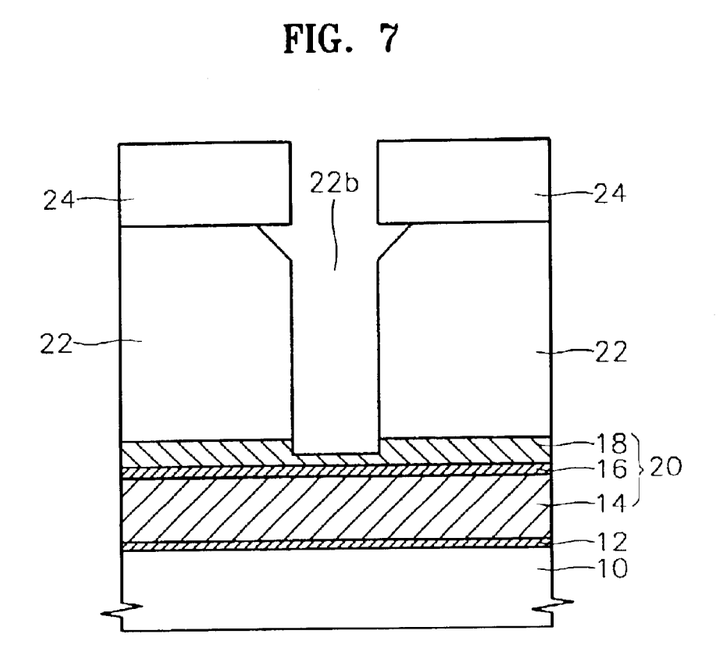

Referring to FIG. 7, the intermetal dielectric layer 22, having the recess 22a therein, is dry etched by using the photoresist pattern 24 as an etch mask and the TiN layer 18 of the first metal interconnection layer 20 as an etch stopper. As a result, a via hole 22b with an opening widened by the wet etch and a bottom which exposes the TiN layer 18 of the first metal interconnection layer 20 is formed. If the width of the via hole 22b is around 250 nm, the via hole 22b has an aspect ratio of about 2.5.

Figure 8:
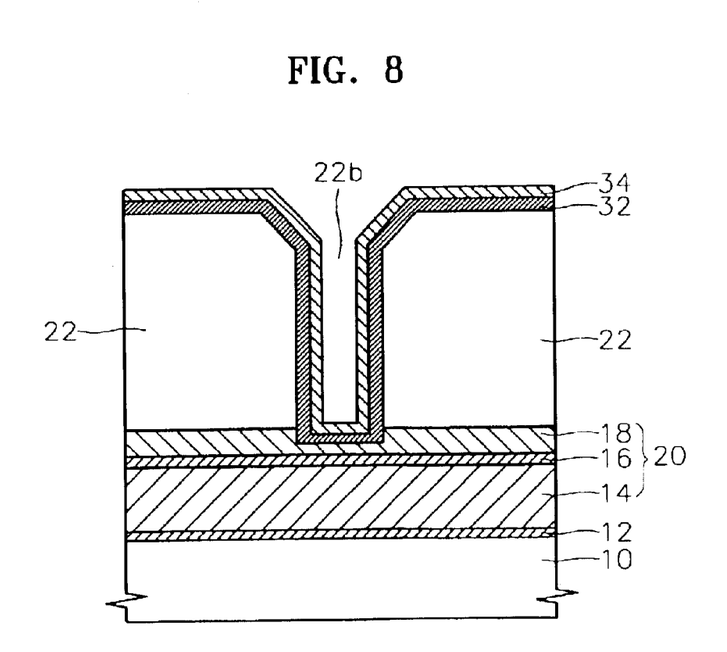
Figure 9:
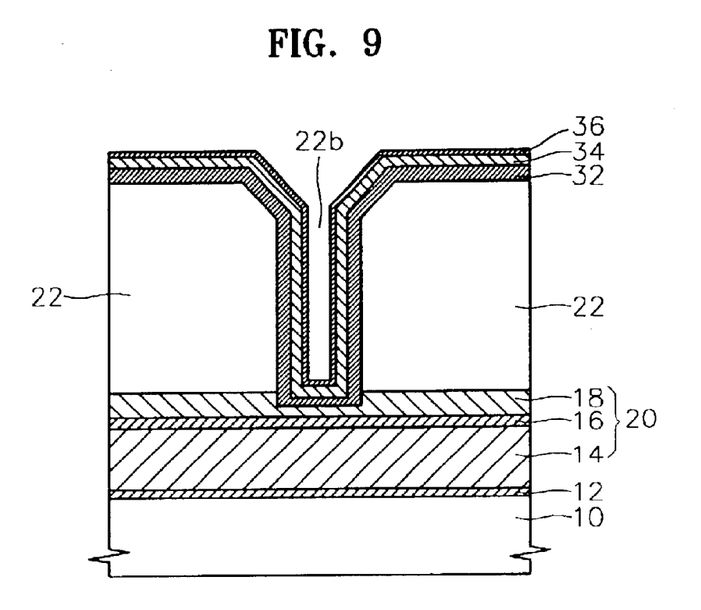

Referring to FIG. 8, after the photoresist pattern 24 is removed, a Ti glue layer 32 is formed on the bottom and sidewalls of the via hole 22b to a thickness of about 100 to 500 Å. A TiN barrier layer 34 is formed on the Ti glue layer 32, to a thickness of about 50 to 300 Å. In this case, the TiN barrier layer 34 is thinner in the via hole 22b than on the intermetal dielectric layer 22 because the TiN barrier layer 34 is deposited in the via hole 22b with a low step coverage according to the relatively high aspect ratio of the via hole 22b. Referring to FIG. 9, a Ti seed layer 36 is formed on the TiN barrier layer 34 for a thickness of about 100 to 200 Å.

Figure 10:
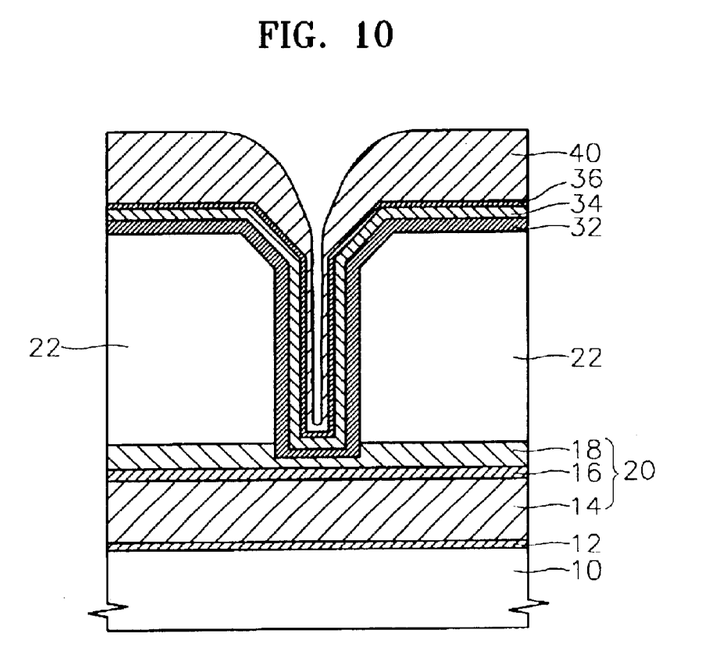

Referring to FIG. 10, in order to form a contact stud in the via hole 22b and a second metal interconnection layer thereon, an Al layer 40 is formed in the via hole 22b and on the intermetal dielectric layer 22, as limited by the Ti seed layer 36. The Al layer 40 may be formed by a physical vapor deposition (PVD) method, such as a direct current (DC) sputtering method, a DC magnetron sputtering method, an alternating current (AC) sputtering method, or a AC magnetron sputtering method. It is preferable that the Al layer 40 is formed by a DC magnetron sputtering method.

Figure 11:
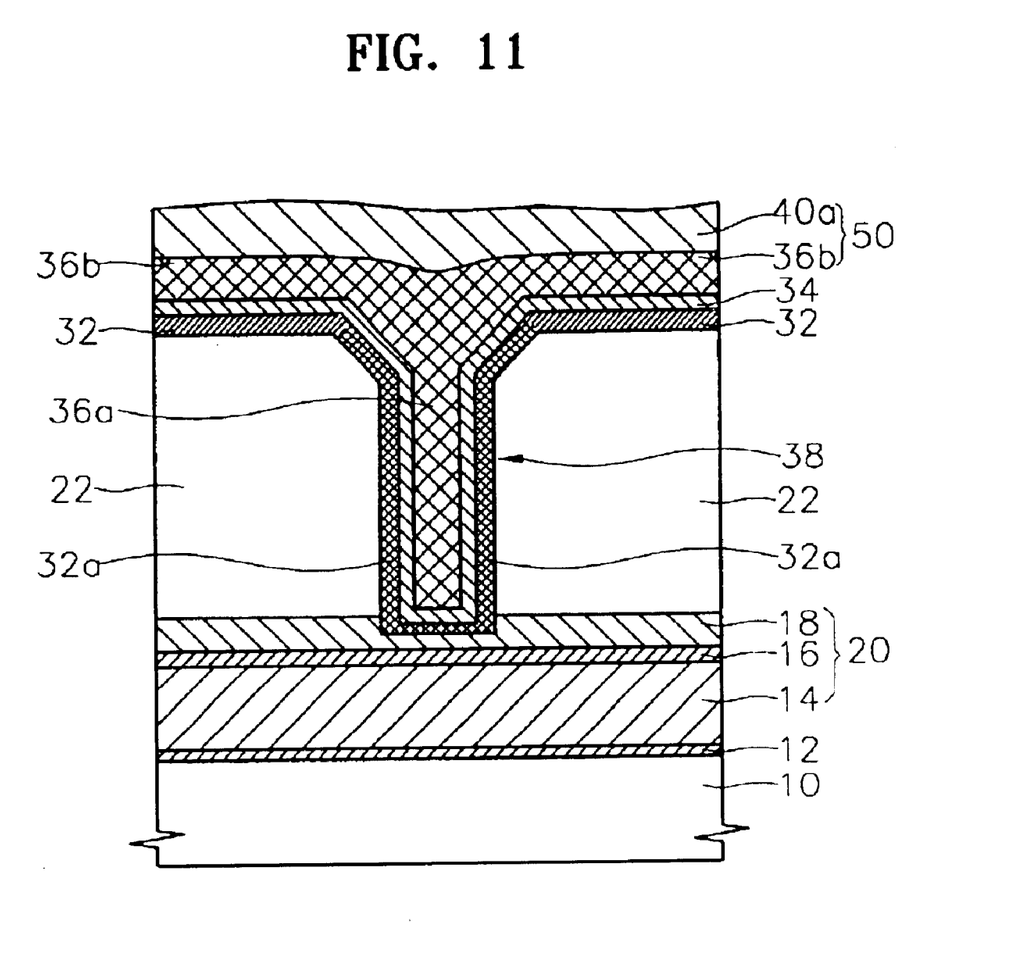

Referring to FIG. 11, the Al layer 40 is reflowed by a thermal process at a temperature of about 350 to 550° C., so as to fill the inside of the via hole 22b with an interconnection material and to form the planar second metal interconnection layer 50 on the intermetal dielectric layer 22. As a result, while forming a contact stud 38 with a TiAlx core 36a and transforming the Ti glue layer 32 into a TiAlx liner 32a in the via hole 22b, a substantially planar Al layer 40a is obtained by inducing a reaction between the Al of the Al layer 40 and the Ti of the Ti glue layer 32 and Ti seed layer 36. Accordingly, the via hole 22b can be completely filled with the contact stud 38, which includes the TiAlx liner 32 covering the bottom and side walls of the via hole 22b, the TiN barrier layer 34 and TiAlx core 36a. Due to the thermal process for the reflow of the Al layer 40, a TiAlx reaction layer 36b having a thickness of over 1000 Å is formed on the TiN barrier layer 34 on the intermetal dielectric layer 22. However, the portion of the Ti glue layer 32, which is formed on the top of the intermetal dielectric layer 22, does not substantially react to Al, so that the Ti glue layer 32 remains substantially pure Ti.

As described above, the contact stud 38 includes the TiAlx core 36a, which penetrates the intermetal dielectric layer 22 so as to electrically connect the first metal interconnection layer 20 to the second metal interconnection layer 50 including the TiAlx reaction layer 36b and planar Al layer 40a. Moreover, the contact stud 38 is formed of a substantially uniform and stable TiAlx liner 32a, TiN barrier layer 34, and TiAlx core 36a. Accordingly, the contact stud 38 can have a sectional profile of substantially uniform shape while providing a low contact resistance. In addition, reaction between the TiN barrier layer 34 and Al can be reduced, so that the generation of the high resistance material, such as AlN, in the contact stud 38 can be reduced.

Figure 12:
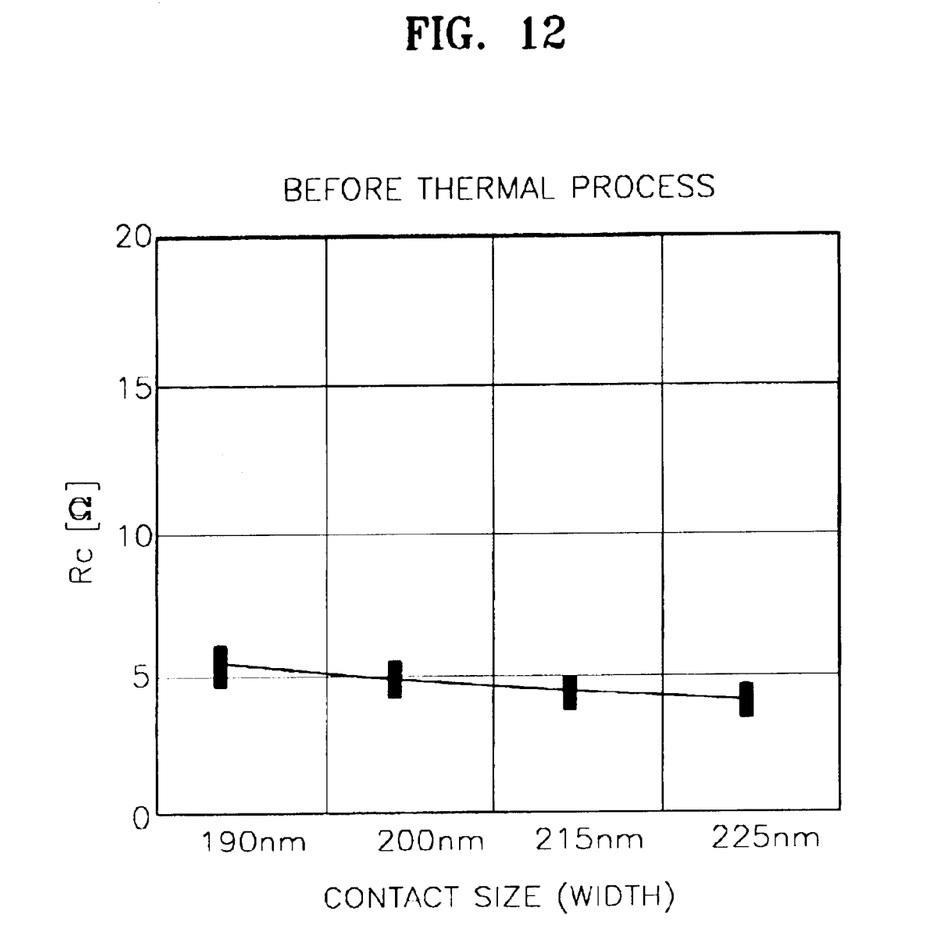
FIGS. 12 and 13 are graphs illustrating resistance distributions of a contact stud in a semiconductor device having the multilevel interconnections according to embodiments of the present invention.
Figure 13:
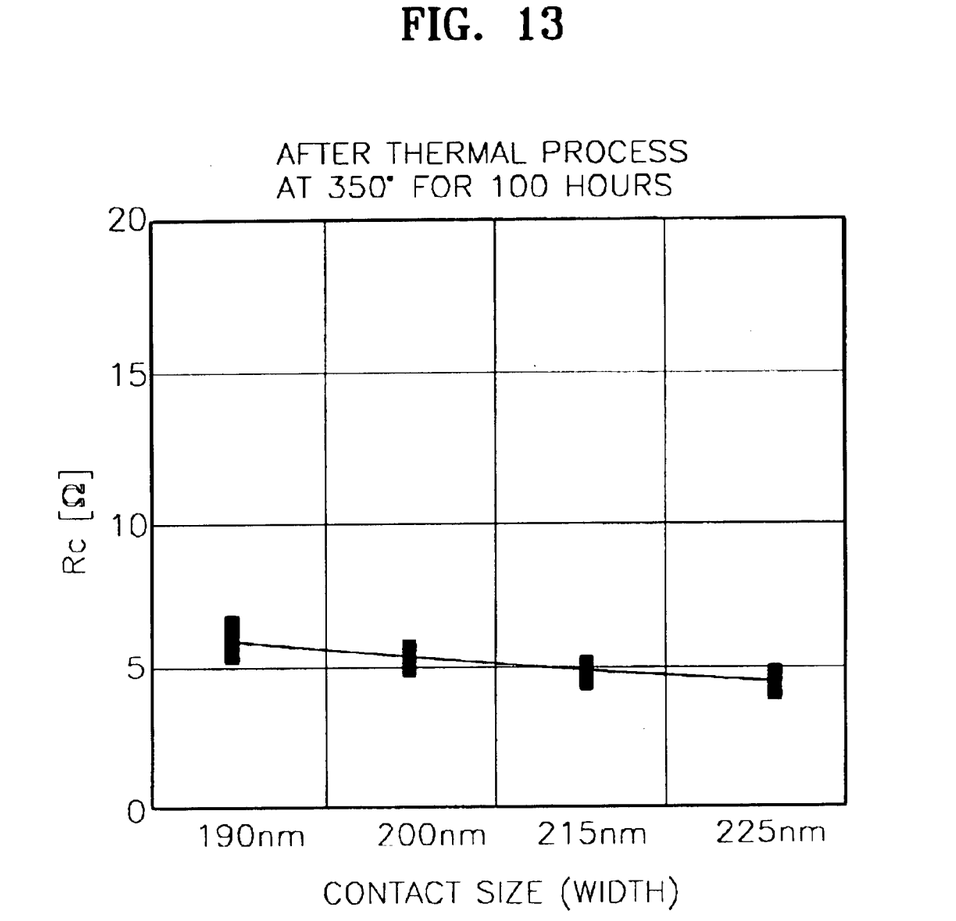

FIGS. 12 and 13 are graphs illustrating resistance distribution for contact studs formed according to embodiments of present invention as shown in FIGS. 5 through 11. FIG. 12 illustrates the contact resistance distribution as a function of contact stud size before the thermal process. FIG. 13 illustrates contact resistance distribution after a hot temperature storage (HTS) reliability test in which the thermal process is performed at a temperature of 350° C. for 100 hours in a nitrogen atmosphere.

As shown in FIGS. 12 and 13, the contact resistance is substantially uniform at a range of about 5 Ω plus or minus 1 Ω, and the resistance distributions are substantially uniform, before and after the thermal process. As a result, the contact resistance may be kept relatively low while improving the resistance distribution by completely filling the contact stud with the TiAlx liner and TiAlx core, which can provide uniform and stable sectional profile regardless of low step coverage of the TIN barrier layer in the contact stud.

A semiconductor device according to embodiments of the present invention includes a contact stud having of a TiAlx core, which fills at least one opening formed on the intermetal dielectric layer, so that the first and second metal interconnection layers on the semiconductor substrate are electrically connected. Since the contact stud for composing the multilevel interconnections has the TiAlx core, which can have a uniform and stable structure, a contact stud with uniform sectional profile can be provided. Moreover, the generation of the high resistance material, such as AlN by the reaction between a TiN barrier layer and Al in the contact stud can be prevented. A contact stud in the semiconductor device according to embodiments of the present invention can provide low contact resistance, and can maintain low contact resistance before and after the thermal process for reducing the contact resistance. Moreover, a contact stud as described herein can maintain a uniform resistance distribution. Using methods for manufacturing the semiconductor device according to embodiments of the present invention, a PVD method, such as a sputtering process, can be applied to form the multilevel interconnections in a high-speed integrated circuit (IC) having a fine feature size with a contact size of less than 250 nm.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device, comprising:
   a first metal interconnection layer on a semiconductor substrate;
   an intermetal dielectric layer on the first metal interconnection layer;
   a second metal interconnection layer on the intermetal dielectric layer; and
   a contact stud electrically connecting the first and second metal interconnection layers through the intermetal dielectric layer, the contact stud comprising a titanium/aluminum (TiAlx) core extending from the first metal interconnection layer toward the second metal interconnection layer, a TiAlx liner disposed on bottom and side walls of the TiAlx core, and a titanium nitride (TiN) barrier layer interposed between the TiAlx core and the TiAlx liner.

2. The semiconductor device of claim 1, wherein the TiAlx liner contacts both the first metal interconnection layer and intermetal dielectric layer.

3. The semiconductor device of claim 1, wherein the first metal interconnection layer comprises aluminum (Al).

4. The semiconductor device of claim 1, wherein the second metal interconnection layer comprises Al.

5. The semiconductor device of claim 1, wherein the first metal interconnection layer comprises:
   an aluminum-containing layer; and
   a reflection barrier capping layer on the aluminum-containing layer.

6. The semiconductor device of claim 5, wherein the reflection barrier capping layer comprises:
   a titanium (Ti) layer on the aluminum-containing layer; and
   a titanium nitride (TiN) layer on the Ti layer.

7. The semiconductor device of claim 6, wherein the contact stud contacts the TiN layer of the reflection barrier capping layer.

8. The semiconductor device claim 1, wherein the intermetal dielectric layer comprises:
   a first tetraethylorthosilicate (P-TEOS) layer on the first metal interconnection layer;
   a flowable oxide (FOX) layer on the first P-TEOS layer; and
   and a second P-TEOS layer on the FOX layer.

9. The semiconductor device claim 1, wherein the width of the contact stud is less than 250 nm.

10. A contact stud for a semiconductor device, comprising:
    a TiAlx core covered by a TiN barrier layer and a TiAlx liner layer that contacts a conductive layer of a semiconductor substrate through an insulating layer.

11. A contact stud according to claim 10, wherein the TiAlx core extends from a TiAlx layer overlying the insulating layer.

12. A method for manufacturing a contact stud in a semiconductor device, the method comprising:
    removing a portion of an insulating layer of a semiconductor substrate to form a hole that exposes an underlying conductive layer;
    forming a glue layer on bottom and side walls of the hole;
    forming a Ti seed layer on the glue layer in the hole;
    forming an aluminum-containing layer on the Ti seed layer; and
    thermally treating the substrate to form a contact stud that extends through the hole in the insulating layer to electrically contact the underlying conductive layer, the contact stud comprising a TiAlx core.

13. The method of claim 12, further comprising forming a TiN barrier layer on the glue layer in the hole before forming the Ti seed layer.

14. The method of claim 12, wherein the aluminum-containing layer is substantially pure Al.

15. The method of claim 12, wherein thermally treating the substrate comprises maintaining the substrate at a temperature of about 350° C. to about 550° C.

16. The method of claim 12, wherein thermally treating the substrate comprises:

reflowing the aluminum-containing layer; and reacting aluminum in the reflowed aluminum layer in the hole with titanium in the Ti seed layer in the hole to form the TiAlx core.

17. The method of claim 16, wherein the reflowing the aluminum-containing layer comprises heating the aluminum-containing layer to a temperature of about 350° C. to about 550° C.

18. The method of claim 12, wherein the glue layer comprises Ti.

19. The method of claim 18, further comprising reacting Ti from the glue layer with Al from the aluminum-containing layer to form a TiAlx liner in the hole.

20. The method of claim 19, wherein the TiAlx liner is formed concurrently with formation of the TiAlx core.

21. A method for manufacturing a semiconductor device, the method comprising:

forming a metal interconnection layer on a semiconductor substrate;

forming an intermetal dielectric layer on the metal interconnection layer;

removing a portion of the intermetal dielectric layer to form a hole therein that exposes a portion of the metal interconnection layer; and forming a contact stud comprising a TiAlx core, a TiAlx liner disposed on bottom and side walls of the TiAlx core, and a titanium nitride (TiN) barrier layer interposed between the TiAlx core and the TiAlx liner in the hole.

22. The method of claim 21, wherein forming a contact stud comprises:

forming a Ti seed layer in the hole;

forming an aluminum-containing layer on the Ti seed layer in the hole; and thermally treating the substrate to form the TiAlx core of the contact stud.

23. The method of claim 22, wherein thermally treating the substrate comprises maintaining the substrate at a temperature of about 350° C. to about 550° C.

24. The method of claim 22, wherein forming the Ti seed layer is preceded by:

forming a Ti glue layer on the bottom and side walls of the hole; and forming a TiN barrier layer on the glue layer.

25. The method of claim 24, wherein thermally treating the substrate comprises transforming the Ti seed layer into a TiAlx liner in the hole while forming the TiAlx core of the contact stud.

26. The method of claim 21, wherein the forming a contact stud comprises:

forming a Ti glue layer on the bottom and side walls of the hole;

forming a TiN barrier layer on the Ti glue layer;

forming a Ti seed layer on the TiN barrier layer;

forming an aluminum-containing layer on the Ti seed layer; and thermally treating the substrate to a TiAlx liner, TiN barrier layer, and the TiAlx core in the hole while reflowing the aluminum-containing layer.

27. The method of claim 26, wherein thermally treating comprises heating the maintaining the substrate at a temperature of about 350° C. to about 550° C.

28. The method of claim 27:

wherein the metal interconnection layer comprises a first metal interconnection layer;

wherein forming an aluminum-containing layer comprises depositing aluminum in the hole and on an upper surface of the intermetal dielectric layer outside of the hole; and wherein a second metal interconnection layer is formed on the TiAlx core and the intermetal dielectric layer by reflowing of the aluminum-containing layer.

29. The method of claim 21, wherein the metal interconnection layer is formed of one selected from Al and Al alloy.

30. The method of claim 21, wherein the forming the intermetal dielectric layer comprises:

forming a first P-TEOS film on the metal interconnection layer;

forming an Fox film on the first P-TEOS film; and forming a second P-TEOS film on the Fox film.

31. The method of claim 21, wherein the forming the metal interconnection layer comprises:

forming an aluminum-containing layer on the semiconductor substrate; and forming a reflection barrier capping layer comprising a Ti layer and a TiN layer on the aluminum-containing layer.

32. The method of claim 31, wherein the TiN layer is used as an etch stopper in forming the hole in the intermetal dielectric layer.

33. The method of claim 21, wherein removing a portion of the intermetal dielectric layer comprises:

wet etching a portion of the intermetal dielectric layer to form a recess on an upper surface of the intermetal dielectric layer; and dry etching the intermetal dielectric layer to expose the metal interconnection layer.

34. The method of claim 21, wherein the metal interconnection layer comprises a TiN capping layer, and wherein removing a portion of the intermetal dielectric layer exposes the TiN capping layer in the hole.

* * * * *